(12) United States Patent
Lu et al.

(10) Patent No.: US 7,888,594 B2
(45) Date of Patent: *Feb. 15, 2011

(54) PHOTOVOLTAIC DEVICE INCLUDING FRONT ELECTRODE HAVING TITANIUM OXIDE INCLUSIVE LAYER WITH HIGH REFRACTIVE INDEX

(75) Inventors: Yiwei Lu, Ann Arbor, MI (US); Willem den Boer, Brighton, MI (US); Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 177 days.

This patent is subject to a terminal disclaimer.

(21) Appl. No.: 11/984,662

(22) Filed: Nov. 20, 2007

(65) Prior Publication Data
US 2009/0126791 A1    May 21, 2009

(51) Int. Cl.
*H01L 31/00*    (2006.01)
(52) U.S. Cl. .................. 136/265; 136/252; 136/260; 136/256; 136/258; 136/261
(58) Field of Classification Search ......... 136/243–244, 136/252, 256, 258, 260, 261, 265
See application file for complete search history.

(56) References Cited
U.S. PATENT DOCUMENTS

| 3,411,934 A | 11/1968 | Englehart et al. |
| 4,155,781 A | 5/1979 | Diepers |
| 4,162,505 A | 7/1979 | Hanak |

(Continued)

FOREIGN PATENT DOCUMENTS
DE    19958878    6/2001

(Continued)

OTHER PUBLICATIONS

Kelly et al. "Zinc oxide-based transparent conductive oxide films prepared by pulsed magnetron sputtering from powder targets: Process Features and film properties". J. Vac. Sci. Technol. A 24 (5), Sep./Oct. 2006.*

(Continued)

*Primary Examiner*—Basia Ridley
*Assistant Examiner*—Lindsey Bernier
(74) *Attorney, Agent, or Firm*—Nixon & Vanderhye P.C.

(57) ABSTRACT

Certain example embodiments of this invention relate to an electrode (e.g., front electrode) for use in a photovoltaic device or the like. In certain example embodiments, a transparent conductive oxide (TCO) of the front electrode for use in a photovoltaic device is of or includes titanium oxide doped with one or more of Nb, Zn and/or Al. Additional layers may also be provided in the front electrode in certain example embodiments. It has been found that the use of transparent conductive $TiO_x$(:Nb) or $TiZnO_x$(:Al and/or Nb), in a front electrode of a photovoltaic device, is advantageous in that such materials have a high refractive index (n) and have a higher transparency than conventional titanium suboxide ($TiO_x$). Thus, the use of such materials in the context of a front electrode of a photovoltaic device reduces light reflection due to the high refractive index, and increases transmission into the active semiconductor film due to the higher transmission characteristics thereof, thereby improving the efficiency of the device.

11 Claims, 5 Drawing Sheets

U.S. PATENT DOCUMENTS

| | | | |
|---|---|---|---|
| 4,163,677 A | 8/1979 | Carlson et al. | |
| 4,213,798 A | 7/1980 | Williams et al. | |
| 4,378,460 A | 3/1983 | Williams | |
| 4,532,373 A | 7/1985 | Matsuura et al. | |
| 4,554,727 A | 11/1985 | Deckman et al. | |
| 4,598,306 A | 7/1986 | Nath et al. | |
| 4,663,495 A | 5/1987 | Berman et al. | |
| 4,689,438 A | 8/1987 | Fukatsu et al. | |
| 4,931,412 A | 6/1990 | Fischer et al. | |
| 5,091,764 A | 2/1992 | Asaoka et al. | |
| 5,110,637 A | 5/1992 | Ando et al. | |
| 5,171,411 A | 12/1992 | Hillendahl et al. | |
| 5,256,858 A | 10/1993 | Tomb | |
| 5,326,519 A | 7/1994 | Claussen | |
| 5,441,827 A * | 8/1995 | Gratzel et al. | 429/111 |
| 5,603,778 A | 2/1997 | Sonoda | |
| 5,650,019 A | 7/1997 | Yamada et al. | |
| 5,667,853 A | 9/1997 | Fukuyoshi et al. | |
| 5,699,035 A | 12/1997 | Ito et al. | |
| 5,861,189 A | 1/1999 | Sheel et al. | |
| 5,964,962 A | 10/1999 | Sannomiya et al. | |
| 6,048,621 A | 4/2000 | Gallego et al. | |
| 6,123,824 A | 9/2000 | Sano et al. | |
| 6,187,824 B1 | 2/2001 | Swank | |
| 6,288,325 B1 | 9/2001 | Jansen et al. | |
| 6,344,608 B2 | 2/2002 | Kariya et al. | |
| 6,406,639 B2 | 6/2002 | Sakaguchi et al. | |
| 6,433,913 B1 | 8/2002 | Bauer et al. | |
| 6,469,438 B2 | 10/2002 | Fukuoka et al. | |
| 6,506,622 B1 | 1/2003 | Shiozaki | |
| 6,613,603 B1 | 9/2003 | Sano | |
| 6,627,322 B2 | 9/2003 | Choi et al. | |
| 6,686,050 B2 | 2/2004 | Lingle et al. | |
| 6,746,775 B1 | 6/2004 | Boire et al. | |
| 6,747,779 B1 | 6/2004 | Morin et al. | |
| 6,784,361 B2 | 8/2004 | Carlson et al. | |
| 6,825,409 B2 | 11/2004 | Haussler et al. | |
| 6,827,970 B2 | 12/2004 | Varanasi et al. | |
| 6,844,210 B2 | 1/2005 | Fukuoka et al. | |
| 6,852,555 B1 | 2/2005 | Roman et al. | |
| 6,933,672 B2 | 8/2005 | Hosokawa | |
| 6,936,347 B2 | 8/2005 | Laird et al. | |
| 6,963,168 B2 | 11/2005 | Eida et al. | |
| 6,963,383 B2 | 11/2005 | Tokailin et al. | |
| 6,972,750 B2 | 12/2005 | Yu | |
| 6,975,067 B2 | 12/2005 | McCormick et al. | |
| 6,979,414 B2 | 12/2005 | Hosokawa | |
| 6,987,547 B2 | 1/2006 | Yang et al. | |
| 6,989,280 B2 | 1/2006 | Ko | |
| 7,012,728 B2 | 3/2006 | Morin et al. | |
| 7,037,869 B2 | 5/2006 | Landa et al. | |
| 7,087,834 B2 | 8/2006 | McFarland | |
| 7,090,921 B2 | 8/2006 | Stachowiak | |
| 7,132,666 B2 | 11/2006 | Nakata et al. | |
| 7,141,863 B1 | 11/2006 | Compaan et al. | |
| 7,144,837 B2 | 12/2006 | Landa et al. | |
| 7,153,579 B2 | 12/2006 | Kriltz et al. | |
| 7,169,722 B2 | 1/2007 | Landa et al. | |
| 2003/0011047 A1 | 1/2003 | Cunningham et al. | |
| 2003/0064255 A1 | 4/2003 | Dannenberg | |
| 2003/0218153 A1 | 11/2003 | Abe | |
| 2004/0038051 A1 | 2/2004 | Fujisawa et al. | |
| 2004/0086723 A1 * | 5/2004 | Thomsen et al. | 428/426 |
| 2004/0113146 A1 | 6/2004 | Dahmani | |
| 2004/0187914 A1 | 9/2004 | Matsuda et al. | |
| 2004/0244829 A1 | 12/2004 | Rearick et al. | |
| 2005/0016583 A1 | 1/2005 | Blieske et al. | |
| 2005/0042460 A1 | 2/2005 | Kriltz | |
| 2005/0217722 A1 * | 10/2005 | Komatsu et al. | 136/263 |
| 2005/0257824 A1 | 11/2005 | Maltby et al. | |
| 2005/0258029 A1 | 11/2005 | Muller et al. | |
| 2006/0065299 A1 | 3/2006 | Fukawa et al. | |
| 2006/0099441 A1 | 5/2006 | Teyssedre et al. | |
| 2006/0169316 A1 | 8/2006 | Thomsen et al. | |
| 2006/0219988 A1 | 10/2006 | Abe | |
| 2006/0228564 A1 | 10/2006 | Demiryont | |
| 2006/0248923 A1 | 11/2006 | Krasnov et al. | |
| 2006/0249199 A1 | 11/2006 | Thomsen et al. | |
| 2006/0289055 A1 * | 12/2006 | Sridharan et al. | 136/252 |
| 2007/0029107 A1 | 2/2007 | Krasnov | |
| 2007/0120045 A1 | 5/2007 | Yokoyama | |
| 2008/0047602 A1 | 2/2008 | Krasnov | |
| 2008/0047603 A1 * | 2/2008 | Krasnov | 136/256 |
| 2008/0105293 A1 * | 5/2008 | Lu et al. | 136/246 |
| 2008/0105298 A1 | 5/2008 | Lu et al. | |
| 2008/0105299 A1 | 5/2008 | Krasnov | |
| 2008/0105302 A1 * | 5/2008 | Lu et al. | 136/258 |
| 2008/0107799 A1 | 5/2008 | Lu et al. | |
| 2008/0163929 A1 | 7/2008 | Krasnov | |
| 2008/0169021 A1 | 7/2008 | Krasnov | |
| 2008/0178932 A1 * | 7/2008 | Den Boer et al. | 136/256 |
| 2008/0210303 A1 * | 9/2008 | Lu et al. | 136/260 |
| 2008/0223430 A1 | 9/2008 | Krasnov et al. | |
| 2008/0223436 A1 | 9/2008 | den Boer et al. | |
| 2008/0302414 A1 * | 12/2008 | den Boer et al. | 136/256 |
| 2008/0308145 A1 | 12/2008 | Krasnov et al. | |
| 2008/0308146 A1 | 12/2008 | Krasnov et al. | |
| 2008/0308151 A1 * | 12/2008 | Den Boer et al. | 136/256 |
| 2009/0084438 A1 * | 4/2009 | den Boer et al. | 136/256 |
| 2009/0194155 A1 | 8/2009 | den Boer et al. | |
| 2009/0194157 A1 | 8/2009 | den Boer et al. | |

FOREIGN PATENT DOCUMENTS

| | | |
|---|---|---|
| EP | 0 180 222 | 5/1986 |
| EP | 0 204 562 | 12/1986 |
| EP | 0 252 489 | 1/1988 |
| EP | 0 303 000 | 3/1989 |
| EP | 372929 A2 * | 6/1990 |
| EP | 0 403 936 | 12/1990 |
| EP | 0 567 735 | 11/1993 |
| EP | 0 987 774 | 3/2000 |
| EP | 1 063 317 | 12/2000 |
| EP | 1 115 160 | 11/2001 |
| EP | 1 174 397 | 1/2002 |
| EP | 1 300 889 | 4/2003 |
| EP | 1 343 176 | 9/2003 |
| FR | 2551267 | 3/1985 |
| GB | 2188924 | 10/1987 |
| JP | 61-141185 | 6/1986 |
| JP | 61-278171 | 12/1986 |
| JP | 62-179165 | 8/1987 |
| JP | 02-106978 | 4/1990 |
| JP | 2164077 | 6/1990 |
| JP | 7122764 | 5/1995 |
| JP | 11-298030 | 10/1999 |
| WO | WO 94/25397 | 11/1994 |
| WO | WO 03/019598 | 3/2003 |
| WO | WO 2006/029073 | 3/2006 |
| WO | WO 2008/036769 | 3/2008 |
| WO | WO 2008/154128 | 12/2008 |

OTHER PUBLICATIONS

U.S. Appl. No. 11/984,092, filed Nov. 13, 2007.

"Improved Fill Factors in Amorphous Silicon Solar Cells on Zinc Oxide by Insertion of a Germanium Layer to Block Impurity Incorporation", Ganguly et al., Applied Physics Letters, vol. 85, No. 3, Jul. 19, 2004, pp. 479-481.

"Improved Transparent Conductive Oxide/p$^+$/i Junction in Amorphous Silicon Solar Cells by Tailored Hydrogen Flux During Growth", Nuruddin et al., Thin Solid Films 394 (2001) pp. 49-63.

"Work Function Determination of Zinc Oxide Films", Sundaram et al., J. Vac. Sci. Technol. A. 15(2), Mar./Apr. 1997, pp. 428-430.

"Optoelectronic Properties of Thin Amorphous and Micro-Crystalline P-Type Films Developed for Amorphous Silicon-Based Solar Cells", Winz et al., Materials Research Society Symposium Proceedings vol. 420, Apr. 1996.

"Investigation of Indium Tin Oxide/Zinc Oxide Multilayer Ohmic Contacts to n-Type GaN Isotype Conjunction", Lee et al., Applied Physics Letters, vol. 78, No. 22, May 28, 2001, pp. 3412-3414.

"The Insert of Zinc Oxide Thin Film in Indium Tin Oxide Anode for Organic Electroluminescence Devices", Jeong et al., Current Applied Physics4 (2004) 655-658.

U.S. Appl. No. 11/507,660, filed Aug. 22, 2006.
U.S. Appl. No. 11/509,094, filed Aug. 24, 2006.
U.S. Appl. No. 11/591,668, filed Nov. 2, 2006.
U.S. Appl. No. 11/790,812, filed Apr. 27, 2007.
U.S. Appl. No. 11/898,641, filed Sep. 13, 2007.

P2-39 Soda Lime Glass as a Substrate for TFT-LCDs, Uchikoga et al., Japan Display '89, Oct. 16-18, pp. 426-429.

"A Transparent Metal: Nb-Doped Anatase $TiO_2$", Furubayashi et al., Applied Physics Letters 86, (2005).

New Transparent Conductors Anatase $Ti_{1-x}M_xO_2$ (M=Nb, Ta): Transport and Optical Properties, Furubayashi et al., Materials Research Society, vol. 905E, 2006.

"Transparent Conductors and Barrier Layers for Thin Film Solar Cells", Gordon et al., Final Technical Report Jun. 15, 2001.

"$TiO_2$-Coated TCO ($SnO_2$:F) Films Prepared by AP-CVD with High Durability against Hydrogen Radicals", Kambe et al., $15^{th}$ International Photovoltaic Science & Engineering Conference (PVSEC-15) China 2005.

"Al-Doped Zinc Oxide Films Deposited by Simultaneous fr and dc Excitation of a Magnetron Plasma: Relationships Between Plasma Parameters and Structural and Electrical Film Properties", Cebulla et al., J.Appl. Phys. 83 (2), Jan. 15, 1998.

"Numerical Modelling of Rear Junction SI Solar Cells Using Fermi-Dirac Statistics", Harder et al., FEIT-Engineering Australian National University, ACT 0200 (4pgs).

"Large-Area Deposition for Crystalline Silicon on Glass Modules", Basore, $3^{rd}$ World Conference on Photovoltaic Energy Conversion, May 2003, (pp. 1-4).

"Physical Properties of Natively Textured Yttrium Doped Zinc Oxide Films by Sol-Gel", Kaur et al., Journal of Materials Science: Materials in Electronics 16 (2005) pp. 649-655.

"Highly Transparent and Conductive Rare Earth Doped ZnO Thin Films Prepared by Magnetron Sputtering", Minami et al., Kanazawa Institute of Technology, Thin Solid Films, vol. 366, pp. 63-68, 2000.

"The Band Structure and Work Function of Transparent Conducting Aluminum and Maganese Co-Doped Zinc Oxide Films", Cao et al., ACTA Metallurgica Sinica (English Letters), vol. 18, No. 3, pp. 356-362, 2005.

"Novel Device Structure for Cu(In, Ga)Se2 Thin film Solar Cells Using Transparent Conducting Oxide Back and Front Contacts", Nakada et al., Solar Energy 77 (2004) 739-747.

"Improvement in Quantum Efficiency of Thin Film Si Solar Cells Due to the Suppression of Optical Reflectance at Transparent Conducting Oxide/Si Interface by TiO2/ZnO Antireflection Coating", Fujibayashi et al., Applied Physics Letters 88, (2006) (2pgs).

"Thin-Film Compound Semiconductor Photovoltaics", Shafarman et al., Materials Research Society, vol. 865, Mar. 29-Apr. 1, 2005.

"Improved Three-Dimensional Optical Model for Thin-Film Silicon Solar Cells", Springer et al., Journal of Applied Physics, vol. 96, No. 9, Nov. 1, 2004.

U.S. Appl. No. 11/600,912, filed Nov. 17, 2006.

"TCO and Light Trapping in Silicon Thin Film Solar Cells". Muller et al., Solar Energy 77 (2004) pp. 917-930.

"CdTe/CdS solar cells on flexible substrates", Mathew, Xavier et al., Solar Energy 77 (2004) 831-838.

"Self-Aligning, Industrially Feasible Back Contacted Silicon Solar Cells with Efficiencies >18%", Muller et al., $3^{rd}$ World Conference on Photovoltaic Energy Conversion, May 11-18, 2003, Osaka, Japan.

"Role of the Glass/TCO Substrate in Thin film Silicon Solar Cells", Muller et al., WCPEC-3, Osaka, Japan, May 11-18, 2003.

"Enhancement of Light Trapping in Silicon Thin-Film Solar Cells by Optimizing From TCO and Back Reflector", Jeon et al. $15^{th}$ Int. Photovoltaic Science & Engineering Conference, China, 2005.

"Recent Applications of Pulsed Lasers in Advanced Materials Processing", Booth, Thin Solid Films 453-454 (2004) pp. 450-457.

"Texture Etched ZnO:Al Coated Glass Substrates for Silicon Based Thin Film Solar Cells", Kluth et al., Thin Solid Films 351 (1999) pp. 247-253.

"TiN and TiO2:Nb Thin Film Preparation Using Hollow Cathode Sputtering with Application to Solar Cells", Guo et al., J. Vac. Sci. Technol. A 24(4) (Jul./Aug. 2006) pp. 1524-1529.

"Physical and Photoelectrochemical Properties of the TiO2-ZnO System", Yoon et al., Materials Research Bulletin, vol. 34, No. 9 (1999) pp. 1451-1461.

"Transparent Conducting Oxides (TCO's) for Amorphous Silicon Solar Cells", Hegedus et al., AIP Conf. Proc. vol. 353, No. 1 (1996) pp. 465-472.

"TiO2 Thin Films as Protective Material for Transparent-Conducting Oxides Used in Si Thin Film Solar Cells", Natsuhara et al., Solar Energy Materials & Solar Cells 90 (2006) pp. 2867-2880.

U.S. Appl. No. 11/591,676, filed Nov. 2, 2006.
U.S. Appl. No. 11/650,564, filed Jan. 8, 2007.
U.S. Appl. No. 11/653,431, filed Jan. 16, 2007.
U.S. Appl. No. 11/717,787, filed Mar. 14, 2007.
U.S. Appl. No. 11/790,687, filed Apr. 26, 2007.
U.S. Appl. No. 11/812,078, filed Jun. 14, 2007.
U.S. Appl. No. 11/808,765, filed Jun. 12, 2007.
U.S. Appl. No. 11/987,664, filed Dec. 3, 2007.
U.S. Appl. No. 12/068,117, filed Feb. 1, 2008.
U.S. Appl. No. 12/068,119, filed Feb. 1, 2008.
U.S. Appl. No. 12/149,263, filed Apr. 29, 2008.
U.S. Appl. No. 12/232,619, filed Sep. 19, 2008.
U.S. Appl. No. 12/285,374, filed Oct. 2, 2008.
U.S. Appl. No. 12/285,890, filed Oct. 15, 2008.

* cited by examiner

| Thickness (nm) | SnOx | SiOx | SnO:F | SiNx | TiOx | ZnAlOx | Ag | NiCrOx | ZnAlOx | Ti based conductive oxide |
|---|---|---|---|---|---|---|---|---|---|---|
| monolithic TCO | 30 | 20 | 350-800 | | | | | | | |
| Ag based TCC-1 | | | | 5 | 15 | 10 | 7 | 1 | 115 | |
| Ag based TCC-2 | | | | 5 | 15 | 10 | 7 | 1 | 85 | 30 |
| Ag based TCC-3 | | | | 5 | 15 | 10 | 7 | 1 | | 75 |

FIG. 6

| n @ 550nm | 1.68 | 1.9 | 2.35 |
|---|---|---|---|
| thickness (nm) | SiOxNy | ZnAlOx | TiNbOx |
| TCO w/o TiNbOx | 80 | 700 | |
| TCO w/ TiNbOx | 80 | 700 | 50 |

FIG. 7

PHOTOVOLTAIC DEVICE INCLUDING FRONT ELECTRODE HAVING TITANIUM OXIDE INCLUSIVE LAYER WITH HIGH REFRACTIVE INDEX

Certain example embodiments of this invention relate to an electrode (e.g., front electrode) for use in a photovoltaic device or the like. In certain example embodiments, a transparent conductive oxide (TCO) of the front electrode for use in a photovoltaic device is of or includes titanium oxide doped with one or more of Nb, Zn and/or Al. Additional layers may also be provided in the front electrode in certain example embodiments. It has been found that the use of transparent conductive $TiO_x(:Nb)$ or $TiZnO_x(:Al$ and/or Nb), in a front electrode of a photovoltaic device, is advantageous in that such materials have a high refractive index (n) and have a higher transparency than conventional titanium suboxide ($TiO_x$). Thus, the use of such materials in the context of a front electrode of a photovoltaic device (especially when positioned adjacent the active semiconductor layer) reduces light reflection due to the high refractive index, and increases transmission into the active semiconductor film due to the higher transmission characteristics thereof, thereby improving the efficiency of the device.

BACKGROUND AND SUMMARY OF EXAMPLE EMBODIMENTS OF INVENTION

Photovoltaic (PV) devices are known in the art (e.g., see U.S. Pat. Nos. 6,784,361, 6,288,325, 6,613,603 and 6,123,824, the disclosures of which are hereby incorporated herein by reference). Amorphous silicon (a-Si) and CdS/CdTe type photovoltaic devices, for example, each include a front contact or electrode. Typically, the front electrode is made of a transparent conductive oxide (TCO) such as tin oxide or zinc oxide formed on a substrate such as a glass substrate. Accordingly, it will be appreciated that zinc oxide doped with Al ($ZnAlO_x$) is a known TCO material for use as an electrode for a photovoltaic device.

Unfortunately, transparent conductive $ZnAlO_x$ has a relatively low refractive index (n) of around 2.0. A TCO layer having such a low refractive index (n), if provided in certain locations of a PV device, tends to reflect significant amounts of incoming solar energy away from the active semiconductor film of the photovoltaic device. In other words, when located at certain positions, the low refractive index material causes significant amounts of incoming energy to be wasted as it is reflected away from the active layer thereby reducing the efficiency of the photovoltaic device.

It is apparent from the above that there exists a need in the art for an improved TCO material which, when positioned in certain locations, is capable of reducing reflections of incoming solar energy without blocking transmission thereof, so as to improve efficiency of the photovoltaic device.

In certain example embodiments, a transparent conductive oxide (TCO) of the front electrode for use in a photovoltaic device is of or includes titanium oxide doped with one or more of Nb, Zn and/or Al. Additional conductive layers may also be provided in the front electrode in certain example embodiments. It has been found that the use of $TiO_x(:Nb)$ or $TiZnO_x(:Al$ and/or Nb) TCO, in a front electrode of a photovoltaic device, is advantageous in that such materials have a high refractive index (n) (e.g., of at least 2.15, more preferably at least 2.2, even more preferably at least 2.3, and possibly at least 2.4 at 550 nm) and have a higher transparency to solar energy used by the PV device than conventional titanium suboxide ($TiO_x$). Thus, the use of such materials in the context of a front electrode of a photovoltaic device (especially when positioned adjacent and contacting the active semiconductor film of the device) reduces light reflection due to the high refractive index, and increases transmission into the active semiconductor film due to the higher transmission characteristics thereof, thereby improving efficiency of the device.

In certain example embodiments of this invention, the TCO may be sputter-deposited in a non-stoichiometric oxygen deficient form, or may be deposited in any other suitable manner. Sputtering at approximately room temperature may be used for the deposition of the electrode in certain example instances, although other techniques may instead be used in certain instances.

In certain example embodiments, the electrode of or including $TiO_x(:Nb)$ or $TiZnO_x(:Al$ and/or Nb) may be used as any suitable electrode in any suitable electronic device, such as a photovoltaic device, a flat-panel display device, and/or an electro-optical device.

In certain example embodiments of this invention, the TCO (e.g., $TiO_x(:Nb)$ or $TiZnO_x(:Al$ and/or Nb)) layer or the overall front electrode may have a sheet resistance ($R_s$) of from about 7-50 ohms/square, more preferably from about 10-25 ohms/square, and most preferably from about 10-15 ohms/square using a reference example non-limiting thickness of from about 1,000 to 2,000 angstroms, although other thicknesses are possible.

In certain example embodiments of this invention, there is provided a photovoltaic device comprising: a front substrate; a front electrode; a semiconductor film, wherein the front electrode is located between at least the front substrate and the semiconductor film; and wherein the front electrode of the photovoltaic device comprises a first conductive layer and a second conductive layer, wherein the second conductive layer is located between at least the first conductive layer and the semiconductor film, and wherein the second conductive layer comprises titanium zinc oxide doped with aluminum and/or niobium.

In other example embodiments, there is provided a photovoltaic device comprising: a front glass substrate; a front electrode; a semiconductor film, wherein the front electrode is located between at least the front substrate and the semiconductor film; and wherein the front electrode of the photovoltaic device comprises a first conductive layer and a second conductive layer, wherein the second conductive layer is located between at least the first conductive layer and the semiconductor film, and wherein the second conductive layer comprises titanium oxide doped niobium.

BRIEF DESCRIPTION OF THE DRAWINGS

FIG. 6 is a table setting forth the layer stacks tested in FIG. 4.

FIG. 7 is a table setting forth the layer stacks tested in FIG. 5.

DETAILED DESCRIPTION OF EXAMPLE EMBODIMENTS OF THE INVENTION

Figure 1:
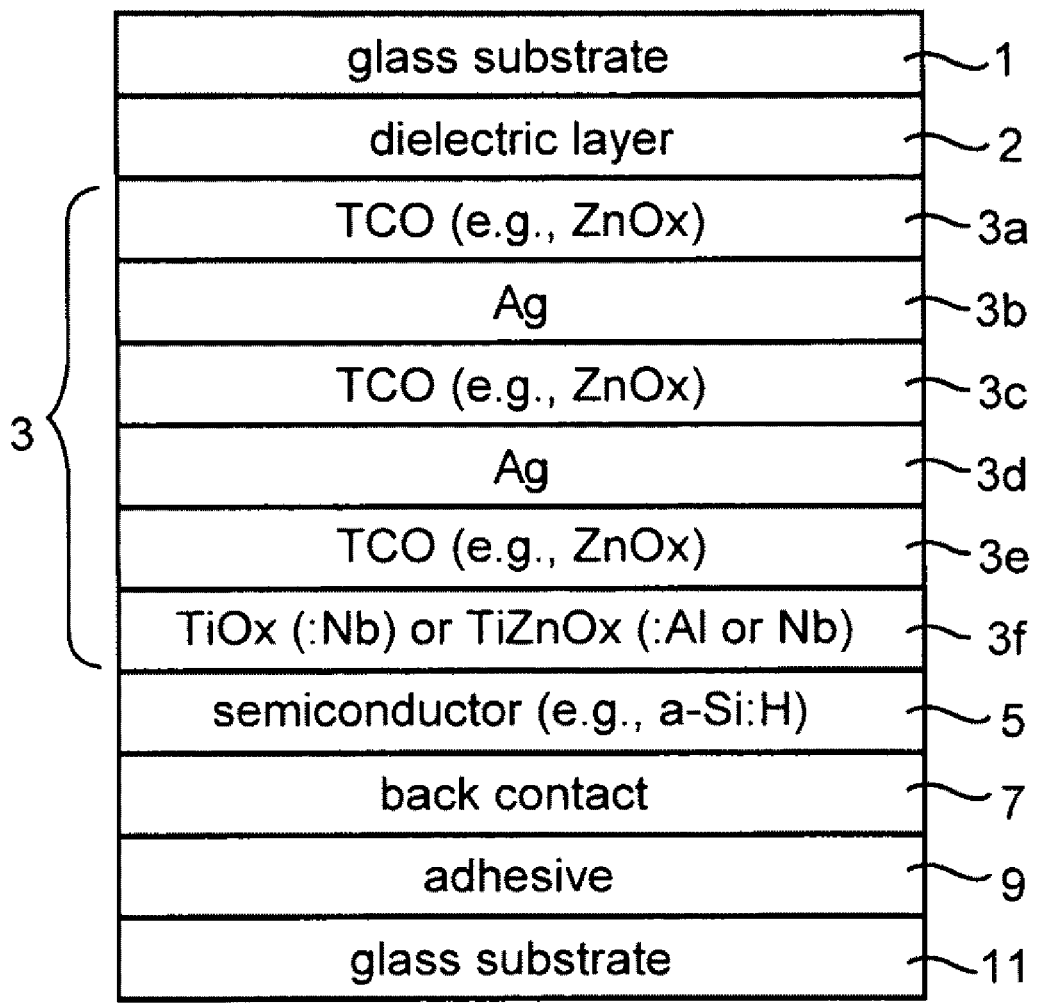
FIG. 1 is a cross sectional view of an example photovoltaic device according to an example embodiment of this invention.

Referring now more particularly to the figures in which like reference numerals refer to like parts/layers in the several views.

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si layers, the semiconductor sometimes being called an absorbing layer or film) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

In certain example embodiments, single junction amorphous silicon (a-Si) photovoltaic devices include three semiconductor layers. In particular, a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention are directed toward amorphous-silicon based photovoltaic devices, this invention is not so limited and may be used in conjunction with other types of photovoltaic devices in certain instances including but not limited to devices including other types of semiconductor material, single or tandem thin-film solar cells, CdS and/or CdTe (including CdS/CdTe) photovoltaic devices, polysilicon and/or microcrystalline Si photovoltaic devices, and the like.

FIG. 1 is a cross sectional view of a photovoltaic device according to an example embodiment of this invention. The photovoltaic device includes transparent front glass substrate 1 (other suitable material may also be used for the substrate instead of glass in certain instances), optional dielectric layer(s) 2, multilayer front electrode 3, active semiconductor film 5 of or including one or more semiconductor layers (such as pin, pn, pinpin tandem layer stacks, or the like), back electrode/contact 7 which may be of a TCO or a metal, an optional encapsulant 9 or adhesive of a material such as ethyl vinyl acetate (EVA) or the like, and an optional superstrate 11 of a material such as glass. Of course, other layer(s) which are not shown may also be provided in the device. Front glass substrate 1 and/or rear superstrate (substrate) 11 may be made of soda-lime-silica based glass in certain example embodiments of this invention; and it may have low iron content and/or an antireflection coating thereon to optimize transmission in certain example instances. While substrates 1, 11 may be of glass in certain example embodiments of this invention, other materials such as quartz, plastics or the like may instead be used for substrate(s) 1 and/or 11. Moreover, superstrate 11 is optional in certain instances. Glass 1 and/or 11 may or may not be thermally tempered and/or patterned in certain example embodiments of this invention. Additionally, it will be appreciated that the word "on" as used herein covers both a layer being directly on and indirectly on something, with other layers possibly being located therebetween.

Dielectric layer(s) 2 may be of any substantially transparent material such as a metal oxide and/or nitride which has a refractive index of from about 1.5 to 2.5, more preferably from about 1.6 to 2.5, more preferably from about 1.6 to 2.2, more preferably from about 1.6 to 2.0, and most preferably from about 1.6 to 1.8. However, in certain situations, the dielectric layer 2 may have a refractive index (n) of from about 2.3 to 2.5. Example materials for dielectric layer 2 include one or more of silicon oxide, silicon nitride, silicon oxynitride, zinc oxide, tin oxide, titanium oxide (e.g., $TiO_2$), aluminum oxynitride, aluminum oxide, or mixtures thereof. Dielectric layer(s) 2 functions as a barrier layer in certain example embodiments of this invention, to reduce materials such as sodium from migrating outwardly from the glass substrate 1 and reaching the IR reflecting layer(s) and/or semiconductor. Moreover, dielectric layer 2 is material having a refractive index (n) in the range discussed above, in order to reduce visible light reflection and thus increase transmission of visible light (e.g., light from about 450-700 nm and/or 450-600 nm) through the coating and into the semiconductor 5 which leads to increased photovoltaic module output power.

Still referring to FIG. 1, multilayer front electrode 3 in the example embodiment shown in FIG. 1, which is provided for purposes of example only and is not intended to be limiting, includes from the glass substrate 1 outwardly first transparent conductive oxide (TCO) or dielectric layer 3a, first conductive substantially metallic IR reflecting layer 3b, second TCO 3c, second conductive substantially metallic IR reflecting layer 3d, third TCO 3e, and transparent conductive overcoat or buffer layer 3f of or including $TiO_x(:Nb)$ or $TiZnO_x(:Al$ and/or Nb)$. Optionally, layer 3a may be a dielectric layer instead of a TCO in certain example instances and serve as a seed layer for the layer 3b. This multilayer film 3 makes up the front electrode in certain example embodiments of this invention. Of course, it is possible for certain layers of electrode 3 to be removed in certain alternative embodiments of this invention (e.g., one or more of layers 3a, 3c, 3d and/or 3e may be removed), and it is also possible for additional layers to be provided in the multilayer electrode 3. Front electrode 3 may be continuous across all or a substantial portion of glass substrate 1, or alternatively may be patterned into a desired design (e.g., stripes), in different example embodiments of this invention. Each of layers/films 1-3 is substantially transparent in certain example embodiments of this invention.

First and second conductive substantially metallic IR reflecting layers 3b and 3d may be of or based on any suitable IR reflecting material such as silver, gold, or the like. These materials reflect significant amounts of IR radiation, thereby reducing the amount of IR which reaches the semiconductor film 5. Since IR increases the temperature of the device, the reduction of the amount of IR radiation reaching the semiconductor film 5 is advantageous in that it reduces the operating temperature of the photovoltaic module so as to increase module output power. Moreover, the highly conductive nature of these substantially metallic layers 3b and/or 3d permits the conductivity of the overall electrode 3 to be increased. In certain example embodiments of this invention, the multilayer electrode 3 has a sheet resistance of less than or equal to about 12 ohms/square, more preferably less than or equal to about 9 ohms/square, and even more preferably less than or equal to about 6 ohms/square. Again, the increased conductivity (same as reduced sheet resistance) increases the overall photovoltaic module output power, by reducing resistive losses in the lateral direction in which current flows to be collected at the edge of cell segments. It is noted that first and second conductive substantially metallic IR reflecting layers 3b and 3d (as well as the other layers of the electrode 3) are thin enough so as to be substantially transparent to visible light. In certain example embodiments of this invention, first and/or second conductive substantially metallic IR reflecting layers 3b and/or 3d are each from about 3 to 12 nm thick, more preferably from about 5 to 10 nm thick, and most preferably from about 5 to 8 nm thick. In embodiments where one of the layers 3b or 3d is not used, then the remaining conductive substantially metallic IR reflecting layer may be from about 3 to 18 nm thick, more preferably from about 5 to 12 nm thick, and most preferably from about 6 to 11 nm thick in certain example embodiments of this invention. These thicknesses are desirable in that they permit the layers 3b and/or 3d to reflect significant amounts of IR radiation, while at the same time being substantially transparent to visible radiation which is permitted to reach the semiconductor 5 to be transformed by the photovoltaic device into electrical energy. The highly conductive IR reflecting layers 3b and 3d attribute to the overall conductivity of the electrode 3 much more than the TCO layers; this allows for expansion of the process window(s) of the TCO layer(s) which has a limited window area to achieve both high conductivity and transparency.

First, second, and third TCO layers 3a, 3c and 3e, respectively, may be of any suitable TCO material including but not limited to conducive forms of zinc oxide, zinc aluminum oxide, tin oxide, indium-tin-oxide, indium zinc oxide (which may or may not be doped with silver), $TiO_x$(:Nb), $TiZnO_x$(:Al and/or Nb), or the like. These layers are typically substoichiometric so as to render them conductive as is known in the art. For example, these layers are made of material(s) which gives them a resistance of no more than about 10 ohm-cm (more preferably no more than about 1 ohm-cm, and most preferably no more than about 20 mohm-cm). One or more of these layers may be doped with other materials such as fluorine, aluminum, antimony or the like in certain example instances, so long as they remain conductive and substantially transparent to visible light. In certain example embodiments of this invention, TCO layers 3c and/or 3e are thicker than layer 3a (e.g., at least about 5 nm, more preferably at least about 10, and most preferably at least about 20 or 30 nm thicker). In certain example embodiments of this invention, TCO layer 3a is from about 3 to 80 nm thick, more preferably from about 5-30 nm thick, with an example thickness being about 10 nm. Optional layer 3a is provided mainly as a seeding layer for layer 3b and/or for antireflection purposes, and its conductivity is not as important as that of layers 3b-3e (thus, layer 3a may be a dielectric instead of a TCO in certain example embodiments). In certain example embodiments of this invention, TCO layer 3c is from about 20 to 150 nm thick, more preferably from about 40 to 120 nm thick, with an example thickness being about 74-75 nm. In certain example embodiments of this invention, TCO layer 3e is from about 20 to 180 nm thick, more preferably from about 40 to 130 nm thick, with an example thickness being about 94 or 115 nm.

Transparent conductive overcoat or buffer layer 3f of or including $TiO_x$(:Nb) and/or $TiZnO_x$(:Al and/or Nb) has been found to be particularly advantageous, especially when located adjacent and contacting the semiconductor film 5. The transparent front electrode serves as both a window and an electrode in the photovoltaic device. It is desired to have low resistivity and high transparency in the PV sensitive wavelength range. Glass 1 has a refractive index (n) of about 1.5 and photovoltaic semiconductor materials 5 (e.g., a-Si; a-Si/uc-Si; CdS/CdTe; CIS; etc.) have refractive indices (n) of at least 3.4. In order to reduce reflection loss caused by big index differences between the glass 1 and semiconductor 5, the use of a transparent conductive oxide having a refractive index (n) of at least 2.15 (more preferably at least 2.2, even more preferably at least 2.3, and possibly at least 2.4 at 550 nm) is provided. When positioned adjacent the semiconductor film 5 as a layer 3f as shown in FIG. 1, this results in a reduction in reflection loss thereby improving the efficiency of the photovoltaic (PV) device. The relatively high refractive index of layer 3f is compared to the lower refractive indices of 1.8 to 2.1 associated with TCOs such as $SnO_x$(:Sb), $ZnO_x$(:Al), $ZnO_x$(:Ga), and $InSnO_x$.

Transparent conductive layer 3f (or 4f) may thus comprise titanium zinc oxide doped with aluminum and/or niobium. In certain example embodiments, the titanium zinc oxide is doped with from about 0.01 to 10% Al and/or Nb, more preferably from about 0.02 to 7% Al and/or Nb, and most preferably from about 0.1 to 5% Al and/or Nb. In other example embodiments, transparent conductive layer 3f (or 4f) may comprise titanium oxide doped niobium (Al may also be provided in such embodiments, in addition to Nb); in certain example embodiments the titanium oxide is doped with from about 0.01 to 10% Nb, more preferably from about 0.02 to 7% Nb, and most preferably from about 0.1 to 5% Nb. Other dopants may also be provided in certain instances.

Transparent conductive layers $TiO_x$(:Nb) and/or $TiZnO_x$(:Al and/or Nb) have a refractive index of at least 2.2 in most situations, are conductive, and have transparency higher than $TiO_x$. Thus, the use of these materials is superior to pure $TiO_x$. However, the resistivity of these materials sometimes tends to be high, so their use in connection with another more conductive layer in the context of a front electrode of a PV device is desirable in certain example embodiments of this invention (e.g., see FIGS. 1-2).

In certain example embodiments of this invention, the photovoltaic device may be made by providing glass substrate 1, and then depositing (e.g., via sputtering or any other suitable technique) multilayer electrode 3 on the substrate 1. Thereafter the structure including substrate 1 and front electrode 3 is coupled with the rest of the device in order to form the photovoltaic device shown in FIG. 1. For example, the semiconductor layer 5 may then be formed over the front electrode on substrate 1. Alternatively, the back contact 7 and semiconductor 5 may be fabricated/formed on substrate 11 (e.g., of glass or other suitable material) first; then the electrode 3 and dielectric 2 may be formed on semiconductor 5 and encapsulated by the substrate 1 via an adhesive such as EVA.

The alternating nature of the TCO layers 3a, 3c and/or 3e, 3f, and the conductive substantially metallic IR reflecting layers 3b and/or 3d, is also advantageous in that it also one, two, three, four or all of the following advantages to be realized: (a) reduced sheet resistance ($R_s$) of the overall electrode 3 and thus increased conductivity and improved overall photovoltaic module output power; (b) increased reflection of infrared (IR) radiation by the electrode 3 thereby reducing the operating temperature of the semiconductor 5 portion of the photovoltaic module so as to increase module output power; (c) reduced reflection and increased transmission of light in the visible region of from about 450-700 nm (and/or 450-600 nm) by the front electrode 3 which leads to increased photovoltaic module output power; (d) reduced total thickness of the front electrode coating 3 which can reduce fabrication costs and/or time; and/or (e) an improved or enlarged process window in forming the TCO layer(s) because of the reduced impact of the TCO's conductivity on the overall electric properties of the module given the presence of the highly conductive substantially metallic layer(s).

The active semiconductor region or film 5 may include one or more layers, and may be of any suitable material. For example, the active semiconductor film 5 of one type of single junction amorphous silicon (a-Si) photovoltaic device includes three semiconductor layers, namely a p-layer, an n-layer and an i-layer. The p-type a-Si layer of the semiconductor film 5 may be the uppermost portion of the semiconductor film 5 in certain example embodiments of this invention; and the i-layer is typically located between the p and n-type layers. These amorphous silicon based layers of film 5 may be of hydrogenated amorphous silicon in certain instances, but may also be of or include hydrogenated amorphous silicon carbon or hydrogenated amorphous silicon germanium, hydrogenated microcrystalline silicon, or other suitable material(s) in certain example embodiments of this invention. It is possible for the active region 5 to be of a double-junction or triple-junction type in alternative embodiments of this invention. CdTe and/or CdS may also be used for semiconductor film 5 in alternative embodiments of this invention.

Back contact, reflector and/or electrode 7 may be of any suitable electrically conductive material. For example and without limitation, the back contact or electrode 7 may be of a TCO and/or a metal in certain instances. Example TCO materials for use as back contact or electrode 7 include indium zinc oxide, indium-tin-oxide (ITO), tin oxide, and/or zinc oxide which may be doped with aluminum (which may or may not be doped with silver). The TCO of the back contact 7 may be of the single layer type or a multi-layer type in different instances. Moreover, the back contact 7 may include both a TCO portion and a metal portion in certain instances. For example, in an example multi-layer embodiment, the TCO portion of the back contact 7 may include a layer of a material such as indium zinc oxide (which may or may not be doped with silver), indium-tin-oxide (ITO), tin oxide, and/or zinc oxide closest to the active region 5, and the back contact may include another conductive and possibly reflective layer of a material such as silver, molybdenum, platinum, steel, iron, niobium, titanium, chromium, bismuth, antimony, or aluminum further from the active region 5 and closer to the superstrate 11. The metal portion may be closer to superstrate 11 compared to the TCO portion of the back contact 7.

The photovoltaic module may be encapsulated or partially covered with an encapsulating material such as encapsulant 9 in certain example embodiments. An example encapsulant or adhesive for layer 9 is EVA or PVB. However, other materials such as Tedlar type plastic, Nuvasil type plastic, Tefzel type plastic or the like may instead be used for layer 9 in different instances.

While the electrode 3 is used as a front electrode in a photovoltaic device in certain embodiments of this invention described and illustrated herein, it is also possible to use the electrode 3 as another electrode in the context of a photovoltaic device or otherwise.

Figure 2:
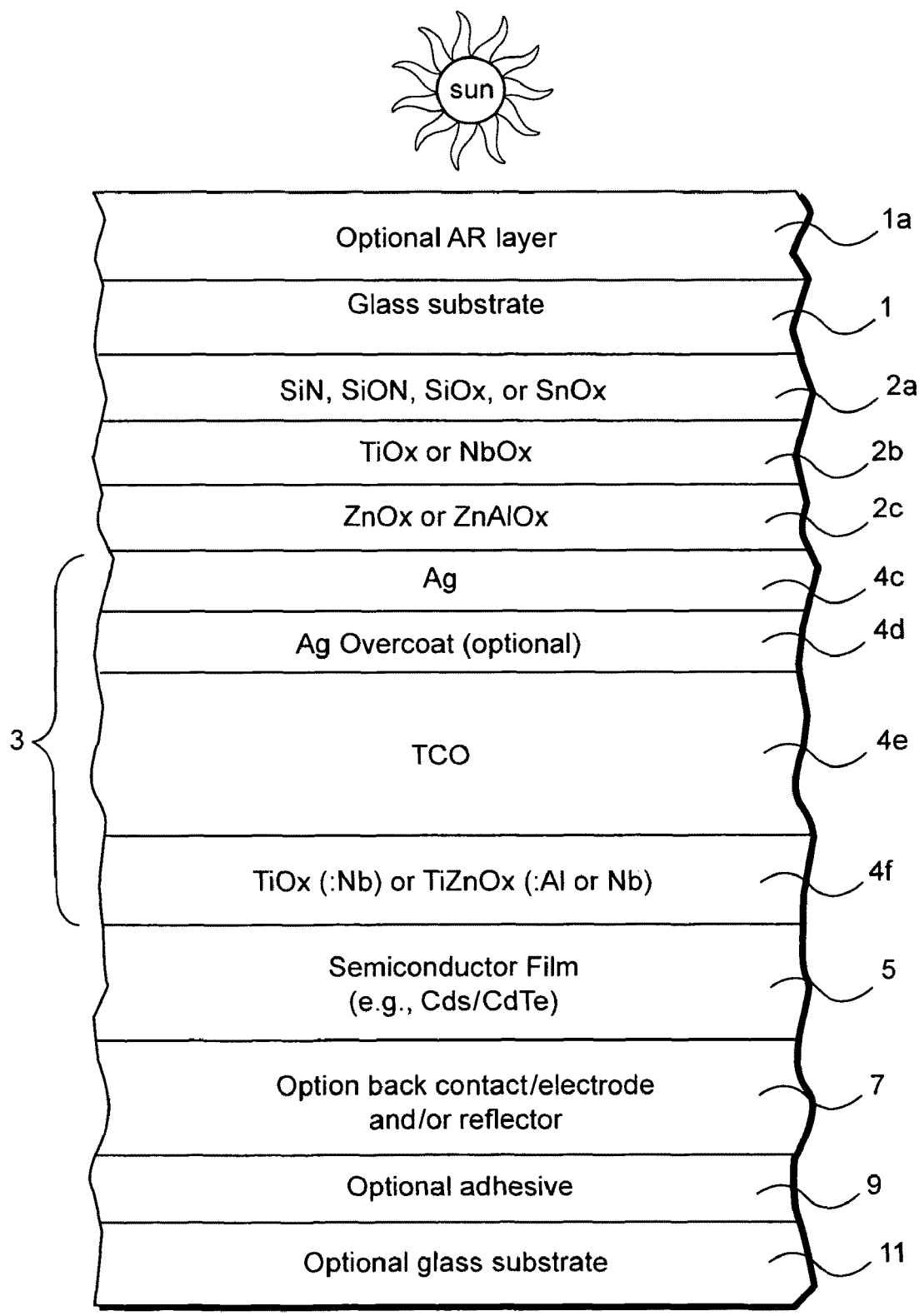
FIG. 2 is a cross sectional view of the photovoltaic device according to another example embodiment of this invention.

FIG. 2 is a cross sectional view of a photovoltaic device according to still another example embodiment of this invention. The photovoltaic device of the FIG. 2 embodiment includes optional antireflective (AR) layer 1a on the light incident side of the front glass substrate 1 (of any suitable material); first dielectric layer 2a of or including one or more of silicon nitride (e.g., $Si_3N_4$ or other suitable stoichiometry), silicon oxynitride, silicon oxide (e.g., $SiO_2$ or other suitable stoichiometry), and/or tin oxide (e.g., $SnO_2$ or other suitable stoichiometry); second dielectric layer 2b of or including titanium oxide (e.g., $TiO_2$ or other suitable stoichiometry) and/or niobium oxide; third layer 2c (which may be a dielectric or a TCO) which may optionally function as a seed layer (e.g., of or including zinc oxide, zinc aluminum oxide, tin oxide, tin antimony oxide, indium zinc oxide, or the like) for the silver based layer 4c; conductive silver based IR reflecting layer 4c; optional overcoat or contact layer 4d (which may be a dielectric or conductive) of or including an oxide of Ni and/or Cr, NiCr, Ti, an oxide of Ti, zinc aluminum oxide, or the like; TCO 4e (e.g., including one or more layers) of or including zinc oxide, zinc aluminum oxide, tin oxide (which may or may not be doped with fluorine), tin antimony oxide, zinc tin oxide, indium tin oxide, indium zinc oxide, and/or zinc gallium aluminum oxide; TCO buffer layer 4f of or including $TiO_x$(:Nb) and/or $TiZnO_x$(:Al and/or Nb); semiconductor film 5 of or including one or more layers such as CdS/CdTe, a-Si, or the like (e.g., film 5 may be made up of a layer of or including CdS adjacent layer 4f, and a layer of or including CdTe adjacent layer 7); optional back contact/electrode/reflector 7 of aluminum or the like; optional adhesive 9 of or including a polymer such as PVB; and optional back/rear glass substrate 11. In certain example embodiments of this invention, dielectric layer 2a may be from about 10-20 nm thick, more preferably from about 12-18 nm thick; layer 2b may be from about 10-20 nm thick, more preferably from about 12-18 nm thick; layer 2c may be from about 5-20 nm thick, more preferably from about 5-15 nm thick (layer 2c is thinner than one or both of layers 2a and 2b in certain example embodiments); layer 4c may be from about 5-20 nm thick, more preferably from about 6-10 nm thick; layer 4d may be from about 0.2 to 5 nm thick, more preferably from about 0.5 to 2 nm thick; TCO film 4e may be from about 50-200 nm thick, more preferably from about 75-150 nm thick, and may have a resistivity of no more than about 100 mΩ in certain example instances; and buffer layer 4f may be from about 10-50 nm thick, more preferably from about 20-40 nm thick and may have a resistivity of no more than about 1 MΩ-cm in certain example instances. Moreover, the surface of glass 1 closest to the sun may be patterned via etching or the like in certain example embodiments of this invention. The $TiO_x$(:Nb) and/or $TiZnO_x$(:Al and/or Nb) inclusive layer 4f in the FIG. 2 embodiment is advantageous for the reasons discussed above in connection with the FIG. 1 embodiment.

Still referring to the FIG. 2 embodiment, semiconductor film 5 may include a single pin or pn semiconductor structure, or a tandem semiconductor structure in different embodiments of this invention. Semiconductor 5 may be of or include silicon in certain example instances. In other example embodiments, semiconductor film 5 may include a first layer of or including CdS (e.g., window layer) adjacent or closest to layer 4f and a second semiconductor layer of or including CdTe (e.g., main absorber) adjacent or closest to the back electrode or contact 7.

Also referring to FIG. 2, in certain example embodiments, first dielectric layer 2a has a relatively low refractive index (n) (e.g., n of from about 1.7 to 2.2, more preferably from about 1.8 to 2.2, still more preferably from about 1.95 to 2.1, and most preferably from about 2.0 to 2.08), second dielectric layer 2b has a relatively high (compared to layer 2a) refractive index (n) (e.g., n of from about 2.2 to 2.6, more preferably from about 2.3 to 2.5, and most preferably from about 2.35 to 2.45), and third dielectric layer 2c may optionally have a relatively low (compared to layer 2b) refractive index (n) (e.g., n of from about 1.8 to 2.2, more preferably from about 1.95 to 2.1, and most preferably from about 2.0 to 2.05). In certain example embodiments, layers 2a-2c combine to form a good index matching stack for antireflection purposes and which also functions as a buffer against sodium migration from the glass 1. In certain example embodiments, the first dielectric layer 2a is from about 5-30 nm thick, more preferably from about 10-20 nm thick, the second dielectric layer 2b is from about 5-30 nm thick, more preferably from about 10-20 nm thick, and the third layer 2c is of a lesser thickness and is from about 3-20 nm thick, more preferably from about 5-15 nm thick, and most preferably from about 6-14 nm thick. While layers 2a, 2b and 2c are dielectrics in certain embodiments of this invention, one, two or all three of these layers may be dielectric or TCO in certain other example embodiments of this invention. Layers 2b and 2c are metal oxides in certain example embodiments of this invention, whereas layer 2a is a metal oxide and/or nitride, or silicon nitride in certain example instances. Layers 2a-2c may be deposited by sputtering or any other suitable technique.

The photovoltaic device of FIG. 2 may have a sheet resistance of no greater than about 18 ohms/square, more preferably no grater than about 15 ohms/square, even more preferably no greater than about 13 ohms/square in certain example embodiments of this invention. Moreover, the FIG. 2 embodiment may have tailored transmission spectra having more than 85% (more preferably at least 87%) transmission into the semiconductor 5 in part or all of the wavelength range of from about 450-600 nm and/or 450-700 nm, where AM1.5 may have the strongest intensity, in certain example embodiments of this invention (e.g., see FIG. 4).

Figure 4:
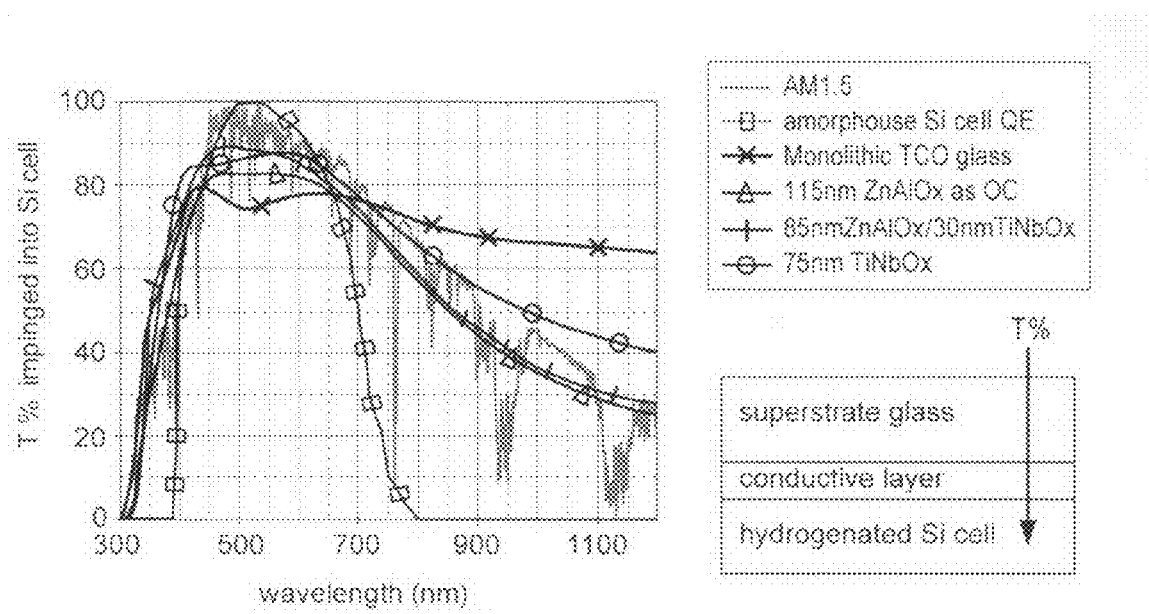
FIG. 4 is a percent transmission (T %) versus wavelength (nm) graph illustrating transmission spectra into a hydrogenated a-Si thin film of a photovoltaic device comparing examples of the FIG. 2 embodiment of this invention versus a comparative example (ZnAlOx) where a zinc aluminum oxide TCO was used instead adjacent the semiconductor; this shows that the examples of this invention have increased transmission in at least a substantial part of the approximately 450-700 nm wavelength range and thus increased photovoltaic module output power, compared to the comparative example. The stacks tested in FIG. 4 are shown in the table of FIG. 6.

FIG. 4 is a percent transmission (T %) versus wavelength (nm) graph illustrating transmission spectra into a hydrogenated a-Si thin film 5 of a photovoltaic device comparing front electrode examples of the FIG. 2 embodiment of this invention versus a comparative example (ZnAlOx) where a zinc aluminum oxide TCO was used instead adjacent the semiconductor. In the 75 nm thick TiNbOx example of the FIG. 2 embodiment shown in FIG. 4, layer 4f of the PV device was a 75 nm thick layer of TiNbO$_x$ and the layer 4e was not present; and in the 75 nm TiNbOx example of the FIG. 2 embodiment shown in FIG. 4, layer 4f of the PV device was a 30 nm thick layer of TiNbO$_x$ and layer 4e was a 85 nm thick layer of ZnAlO$_x$. It can be seen from FIG. 4 that these two example embodiments of this invention (see the circle and vertical bar lines in FIG. 4) surprisingly realized increased transmission into the semiconductor 5 compared to the comparative example (115 nm ZnAlOx as layer 4e where layer 4f did not exist) in at least substantial parts of the range of from 450-700 nm, more preferably the range of from 475-600 nm. This shows that the examples of this invention have increased transmission in at least a substantial part of the approximately 450-700 nm wavelength range (or in at least a substantial part of the 475-600 nm range) and thus increased photovoltaic module output power, compared to the comparative example. The stacks tested in FIG. 4 are shown in the table of FIG. 6, with the last two lines in FIG. 6 illustrating the stacks of the examples of this invention tested in FIG. 4, and the TCC-1 line in FIG. 6 illustrating the layer stack of the comparative example discussed above. The first line in FIG. 6 illustrates the stack of another comparative example tested in FIG. 4.

Figure 3:
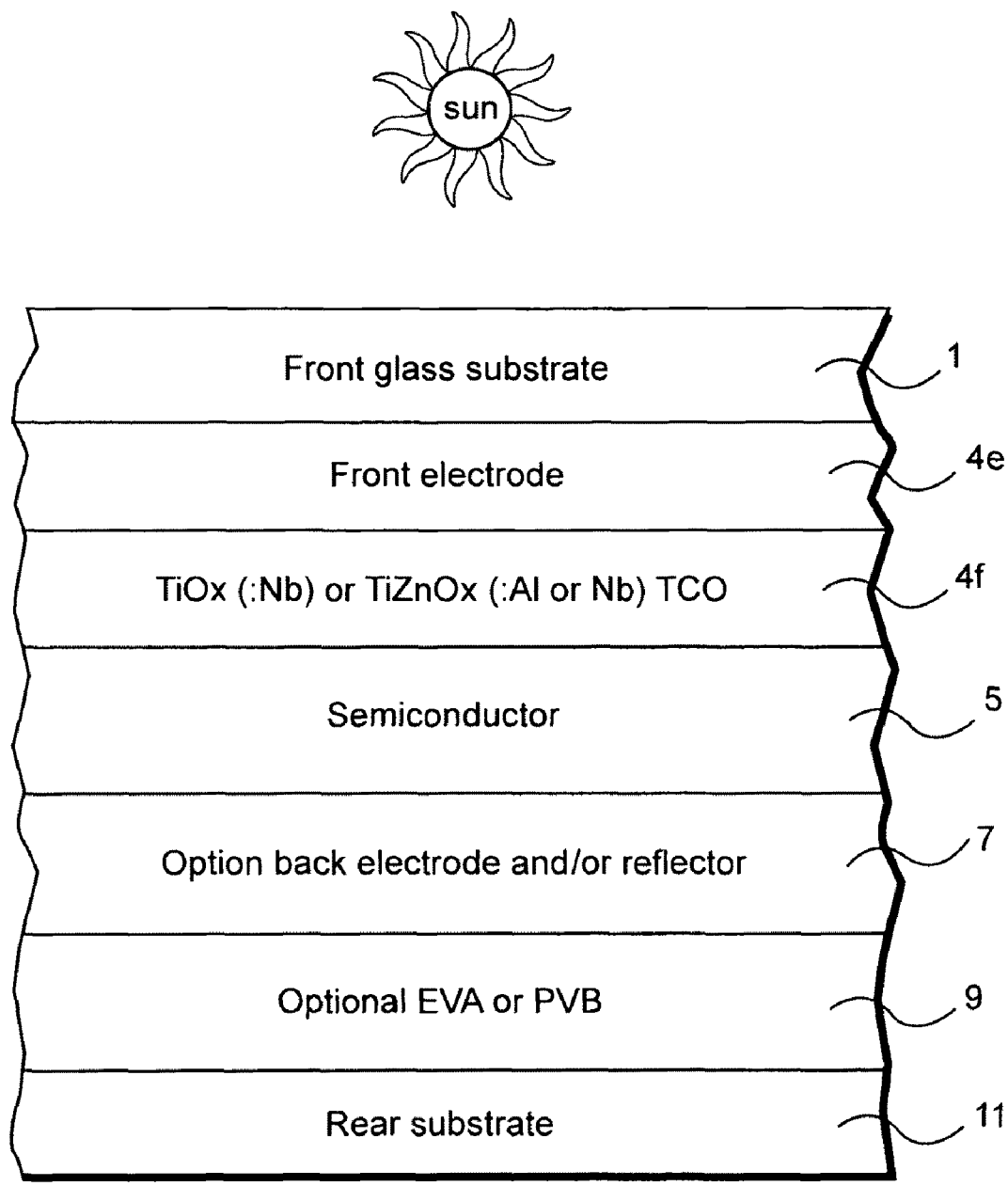
FIG. 3 is a cross sectional view of the photovoltaic device according to another example embodiment of this invention.

FIG. 3 is a cross sectional view of a photovoltaic device according to yet another example embodiment of this invention. The FIG. 3 embodiment differs from the FIG. 1-2 embodiments, for example, in that the FIG. 3 embodiment does not include a Ag conductive layer in the front electrode. Instead, the front electrode in the FIG. 3 embodiment is of or includes a TCO 4e (e.g., including one or more layers) of or including zinc oxide, zinc aluminum oxide, tin oxide (which may or may not be doped with fluorine), tin antimony oxide, zinc tin oxide, indium tin oxide, indium zinc oxide, and/or zinc gallium aluminum oxide; and TCO buffer layer 4f of or including TiO$_x$(:Nb) and/or TiZnO$_x$(:Al and/or Nb). The semiconductor film 5 may be of or including a-Si, or any other suitable semiconductor discussed above. Transparent conductive TiO$_x$(:Nb) and/or TiZnO$_x$(:Al and/or Nb) layer 4f in the FIG. 3 embodiment is advantageous for the reasons set forth above in connection with the FIG. 1-2 embodiments, and is characterized by the thicknesses and resistance values discussed above.

Figure 5:
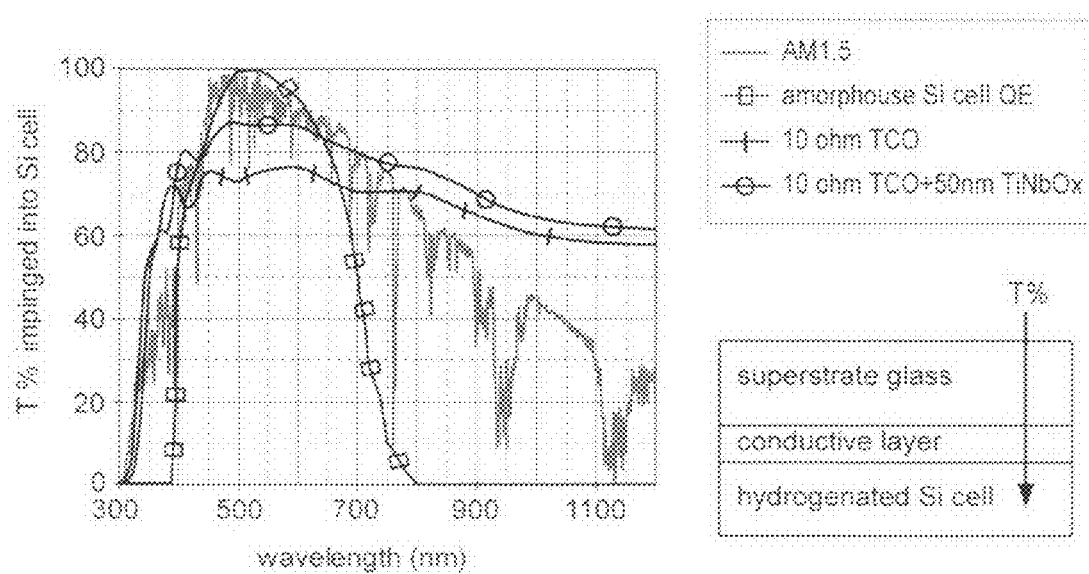
FIG. 5 is a percent transmission (T %) versus wavelength (nm) graph illustrating transmission spectra into a hydrogenated a-Si thin film of a photovoltaic device comparing examples of the FIG. 3 embodiment of this invention versus a comparative example (TCO) where only a zinc aluminum oxide TCO was used instead adjacent the semiconductor; this shows that the examples of this invention (10 ohm TCO+50 nm TiNbOx) have increased transmission in at least a substantial part of the approximately 450-700 nm wavelength range and thus increased photovoltaic module output power, compared to the comparative example (10 ohm TCO). The stacks tested in FIG. 5 are shown in the table of FIG. 7.

FIG. 5 is a percent transmission (T %) versus wavelength (nm) graph illustrating transmission spectra into a hydrogenated a-Si thin film 5 of a photovoltaic device comparing a front electrode example of the FIG. 3 embodiment of this invention (see 10 ohm TCO+50 nm TiNbOx) versus a comparative example (ZnAlOx). In the comparative example, only a 700 nm thick zinc aluminum oxide TCO was used as the front electrode immediately adjacent the semiconductor film 5. In the example of the FIG. 3 embodiment tested in connection with FIG. 5, the front electrode was made up of a 700 nm thick TCO 4e of zinc aluminum oxide and a 50 nm thick TCO 4f of titanium niobium oxide immediately adjacent and contacting the semiconductor film 5. The stacks tested in FIG. 5 are set forth in the table of FIG. 7, with the last line in FIG. 7 representing the example according to the FIG. 3 embodiment of this invention (with an additional layer of silicon oxynitride between the glass 1 and the front electrode), and the next to last line in FIG. 7 representing the comparative example of FIG. 5. It can be seen from FIG. 5 that the example embodiment of this invention (see the circle line in FIG. 5) surprisingly realized increased transmission into the semiconductor 5 compared to the comparative example (see the vertical bar line in FIG. 5) in at least a substantial part of the range of from 450-700 nm, more preferably at least in a substantial part of the range of from 475-600 nm. This shows that the examples of this invention have increased transmission in at least a substantial part of the approximately 450-700 nm wavelength range (or in at least a substantial part of the 475-600 nm range) and thus increased photovoltaic module output power, compared to the comparative example.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A photovoltaic device comprising:
a front substrate;
a front electrode;
a semiconductor film, wherein the front electrode is located between at least the front substrate and the semiconductor film; and
wherein the front electrode of the photovoltaic device comprises a first conductive layer and a second conductive layer, wherein the second conductive layer is located between at least the first conductive layer and the semiconductor film, wherein the second conductive layer consists of titanium zinc oxide doped with aluminum and/or niobium.

2. The photovoltaic device of claim 1, wherein the titanium zinc oxide is doped with from about 0.01 to 10% Al and/or Nb.

3. The photovoltaic device of claim 1, wherein the titanium zinc oxide is doped with from about 0.02 to 7% Al and/or Nb.

4. The photovoltaic device of claim 1, wherein the titanium zinc oxide is doped with from about 0.1 to 5% Al and/or Nb.

5. The photovoltaic device of claim 1, further comprising:
a first layer comprising one or more of silicon nitride, silicon oxide, silicon oxynitride, and/or tin oxide;
a second layer comprising one or more of titanium oxide and/or niobium oxide, wherein at least the first layer is located between the front substrate and the second layer, wherein the first layer and the second layer are located between at least the front substrate and the front electrode;
a third layer comprising zinc oxide and/or zinc aluminum oxide; and
wherein the first conductive layer comprises silver, which is contacts said third layer comprising zinc oxide and/or zinc aluminum oxide.

6. The photovoltaic device of claim 1, wherein the second conductive layer of the front electrode has a refractive index (n) of at least about 2.2.

7. The photovoltaic device of claim 1, wherein the first conductive layer is a TCO comprising one or more of zinc oxide, zinc aluminum oxide, tin oxide, indium-tin-oxide, indium zinc oxide, tin antimony oxide, and zinc gallium aluminum oxide.

8. The photovoltaic device of claim 1, wherein the first conductive layer comprises silver.

9. The photovoltaic device of claim 1, wherein the semiconductor film comprises (i) a-Si, or (ii) a first layer comprising CdS and a second layer comprising CdTe.

10. The photovoltaic device of claim 1, wherein the photovoltaic device, including the front electrode and front substrate, has an ambient transmission of at least 85% into the semiconductor film in at least a substantial part of the wavelength range of from about 450-600 nm.

11. The photovoltaic device of claim 1, wherein the photovoltaic device, including the front electrode and front substrate, has an ambient transmission of at least 87% into the semiconductor film in at least a substantial part of the wavelength range of from about 450-600 nm.

* * * * *